United States Patent [19]
Kovacic

[11] Patent Number: 5,686,744
[45] Date of Patent: Nov. 11, 1997

[54] COMPLEMENTARY MODULATION-DOPED FIELD-EFFECT TRANSISTORS

[75] Inventor: Stephen Joseph Kovacic, Kanata, Canada

[73] Assignee: Northern Telecom Limited, Montreal, Canada

[21] Appl. No.: 665,735

[22] Filed: Jun. 17, 1996

[51] Int. Cl.$^6$ .......................... H01L 29/80; H01L 31/12; H01C 31/0328; H01C 31/0336
[52] U.S. Cl. .......................... 257/280; 257/281; 257/192
[58] Field of Search .................................. 257/280, 251, 257/192

[56] References Cited

U.S. PATENT DOCUMENTS

| | | | |
|---|---|---|---|
| 4,710,788 | 12/1987 | Däembkes et al. | 357/22 |
| 5,019,882 | 5/1991 | Solomon et al. | 357/23.8 |
| 5,442,205 | 8/1995 | Brasen et al. | 257/192 |

OTHER PUBLICATIONS

H. Deambkes, et al., "The n–Channel Si/Ge Modulation–Doped Transistor," May 1986, pp. 633–638, IEEE Trans. Electron Dev. vol. ED–33, No. 5.

T.P. Pearsall, et al., "Enhancement–and Depletion–Mode p–Channel $Ge_xSi_{1-x}$/Si Modulation–Doped FET's,"May 1986, pp. 308–310, IEEE Electron Device Letters, vol. EDL–7.

R. Dingle, et al., "Electron Mobilities in Modulation–Doped Semiconductor Heterojunction Superlattice," Oct. 1978, pp. 665–667, Appl. Phys. Lett., vol. 33.

G. Abstreiter, et al., "Strain–induced two–dimensional electron gas in selectively doped $Si/Si_{1-x}Ge_x$ Superlattice," Physical Review Letters vol. 54, pp. 2441–2444.

R. People, "Physics and Applications of $Ge_xSi_{1-x}$/Si Strained Layer Heterostructures," Sep. 1986, pp. 1696–1710, IEEE Journal of Quantum Electronics, vol. QE 22.

R. People, "Indirect band gap of coherently strained $Ge_xSi_{1-x}$ bulk alloys on (001) silicon substrate," Jul. 1985 Physical Revie B vol. 32 No. 2, pp. 1405–1408.

R. People, "Modulation doping in $Ge_xSi_{1-x}$/Si strained–layer heterostructure," Dec. 1984, pp. 1231–1233, Appl. Phys. Lett. 45.

C. Weisbuch and B. Vinter, Quantum Semiconductor Structure, Academic Press, 1991.

S.K. Ghandi, VLSI Fabrication Principles: Silicon and Gallium Arsenide, John Wiley & Sons, Inc., New York, N.Y., 1983.

Primary Examiner—Stephen Meier
Attorney, Agent, or Firm—Foley & Lardner

[57] ABSTRACT

Complementary Modulation-Doped Field-Effect Transistors (CMODFETs) using a heterostructure based Silicon and Germanium alloys are described. The design of the $Si/Si_{1-x}Ge_x$-based CMODFET is also presented and shown to enable both n-channel or p-channel transport between source and drain implantation regions of the carriers with mobilities enhanced by 1) low ionized dopant scattering phenomena and 2) discretization of the free carrier energy due to quantum confinement.

20 Claims, 6 Drawing Sheets

COMPLEMENTARY MODULATION-DOPED FIELD-EFFECT TRANSISTORS

FIELD OF THE INVENTION

The invention relates to a semiconductor heterostructure which permits the realization of both n and p-channel MODFETs (modulation-doped field effect transistors) on the same substrate, and also to n and p-channel MODFETs realized on such a heterostructure, together with methods for making the heterostructure and MODFETs.

BACKGROUND OF THE INVENTION

A MODFET has a drain electrode and a source electrode between which a channel is located, the conductivity of the channel being controlled by a gate voltage applied to a gate electrode. The intrinsic semiconductor layer is located between the channel and the gate electrically isolating the gate from the channel.

A conventional p-channel or n-channel MODFET device is fabricated on a silicon wafer utilizing a heterostructure of semiconductor alloys to form regions where either holes or electrons, respectively find a local energy minimum in the energy band diagram. These regions are coplanar with the surface of the wafer and can extend over its entire area. The local energy minimum is formed by creating an epitaxial, single crystal stack of various semiconductor materials with differing energy bandgaps and doping. Where the wide and narrow bandgap materials meet is referred to as a heterojunction, and this is where hetero-offsets in the conduction and valence band are found. It is at the heterojunction, typically, where the local energy minimum for free carriers is found [1]. In this local energy minimum, the population of either holes or electrons will be greater than in the surrounding semiconductor material. Charge carriers injected from the source and drain electrodes will reside or be conducted in this energy minimum. In the case of an n-channel device, a minimum for electrons exists, and a channel linking heavily n-doped (n+doped) source and, drain implants can be formed. Similarly, in a p-channel device, a minimum for holes exists, and a channel linking heavily p-doped (p+doped) source and drain implants can be formed. Usually, the conduction properties of the channel will be dependent upon the bias voltage applied to a gate which is relatively electrically isolated from the source, drain and channel. The gate potential modulates the free carrier population in the channel and, thereby, modulates the conductivity of the channel linking the source and drain.

The channel region of the MODFET is also designed to lie in a semiconductor material of high purity (preferably undoped) in order to avoid as much as possible ionized dopant scattering of the free carriers as they flow from source to drain [1]. Scattering mechanisms lower the mobility of free carriers and degrade the conduction properties of the device. Additionally, depending on the doping in the channel region, the narrowness of the channel may be sufficient to induce quantum confinement effects which, in turn, enhances carrier mobility. The quantum confinement of the carriers induces a discretization of the free energy levels available to the carriers and removes a degree of freedom from the motion of the carriers [2]. This enhances carrier transport in the direction linking the source and drain as a two-dimensional particle gas is formed [3].

In the layered structure used conventionally to fabricate MODFETs such as that shown in FIG. 1a, either an n-channel or a p-channel device can be formed, but not both. This is because only one heterojunction is created and only one type of dopant is used in the layer sequence. In the case of an n-channel MODFET, a local minimum for electrons is formed by growing sequentially on a lightly doped, narrow-bandgap substrate, a thin layer of heavily n-doped wide bandgap semiconductor followed by a layer of lightly doped n-type or p-type or pure wide bandgap semiconductor. An n-channel forms at the heterojunction between the wide and narrow bandgap semiconductors. A source of free carriers in the channel is provided by the ionized dopants in the heavily n-doped, wide-bandgap layer adjacent to the heterojunction. The lightly doped, wide bandgap material electrically isolates the gate from the channel region. In this situation, no energy minimum for holes exists and consequently CMODFETs based on the heterostructure of FIG. 1 are not feasible.

The ability to realize CMODFETs, that is, on the same underlying substrate, the ability to form both n-channel and p-channel modulation-doped field-effect transistors is highly desired for various digital and analog circuit applications.

U.S. Pat. No. 5,019,882 to Solomon et al. discloses a semiconductor layered structure which allows the fabrication of p-channel MODFETs and n-channel MOSFETS. A germanium channel provides an energy minimum for holes, and this channel is employed for the MODFET. However, no energy minimum for electrons exists in the germanium channel because the hetero-offset in the conduction band between geranium and silicon is very small. As such, electrons are not constrained to the germanium channel, and instead float to the surface resulting in an n-channel in the layer of silicon beneath the gate, and causing the device to behave like an n-channel MOSFET. Thus, the advantage of having both n and p-channel MODFETs on the same substrate is not achieved with this structure.

In U.S. Pat. No. 4,710,788 to Daembkes et al., a doped $Si_{1-x}Ge_x$ layer is used to form an n-channel MODFET. Although a bandgap diagram is shown which makes it apparent that an energy minimum exists for each of electrons and holes, the minimum for holes is in a doped layer. The doping causes scattering, and reduces conductivity, making it impractical for use as a channel.

SUMMARY OF THE INVENTION

An object of the invention is to provide a heterostructure which allows the fabrication of both n-channel and p-channel MODFETs on the same substrate using the same underlying set of semiconductor layers.

The invention according to one aspect provides a five layer heterostructure. The first and fifth layers are made of undoped or lightly p-doped silicon or silicon alloy. The second and fourth layers are made of silicon or silicon alloy, and are heavily n-doped. Finally, the third layer is a silicon alloy which, is undoped. The channels of the MODFET devices fabricated with this heterostructure are located in this third layer.

The fifth layer electrically isolates the structure from the surface, where electrodes may subsequently be located. The second and fourth layers pull down the conduction band in the channel layer to form an electron well. The third layer must possess a valence band hetero-offset with respect to the second and fourth layers thereby forming a hole trap.

The resulting structure allows electron and hole conductivity in the channel layer because an energy minimum exists in the channel for both electrons and holes.

By implanting a heavily n-doped source and a heavily n-doped drain region from the surface down through at least a portion of the channel layer an n-channel MODFET may be created. Similarly implanted heavily p-doped source and drain regions result in a p-channel MODFET. Both n-channel and p-channel devices may be fabricated on the same heterostructure.

According to another embodiment, the invention provides a modification of the heterostructure described above in which the function of the fourth and fifth layers is realized with a mesa structure. In this embodiment the basic structure includes the first three layers as described previously, and fourth and fifth layers only between source and drain regions implanted in the channel layer.

According to another aspect, the invention provides a method of making a CMODFET(complementary MODFET) circuit comprising the steps of: a) forming on a substrate a heterostructure by performing the steps of: i) forming on a substrate a first lightly p-doped layer of silicon or silicon alloy; ii) forming a second heavily n-doped layer of silicon or silicon alloy; iii) forming a third silicon alloy layer; iv) forming a fourth heavily n-doped layer of silicon or silicon alloy; v) forming a fifth lightly p-doped layer of silicon or silicon alloy; wherein a conduction band well exists in the third layer and a valence band hetero-offset exists between the third layer and each of the second and fourth layers; b) forming at least one n-channel MODFET on the heterostructure, comprising the steps of: i) implanting a heavily n-doped source region and a heavily n-doped drain region extending from spaced apart locations on the fifth layer of the heterostructure down through at least a portion of the third layer; and ii) placing a source electrode on the surface of the source region, a drain electrode on the surface of the drain region, and a gate electrode on the fifth layer between the source electrode and the drain electrode; c) forming at least one p-channel MODFET on the heterostructure, comprising the steps of: i) implanting a heavily p-doped source region and a heavily p-doped drain region extending from spaced apart locations on the fifth layer of the heterostructure down through at least a portion of the third layer; and ii) placing a source electrode on the surface of the source region, a drain electrode on the surface of the drain region, and a gate electrode on the fifth layer between the source electrode and the drain electrode.

BRIEF DESCRIPTION OF THE FIGURES

The invention will be further described with reference to the attached drawings in which:

FIG. 2b is the energy band diagram of the layer sequence of FIG. 2a;

Figure 1A:
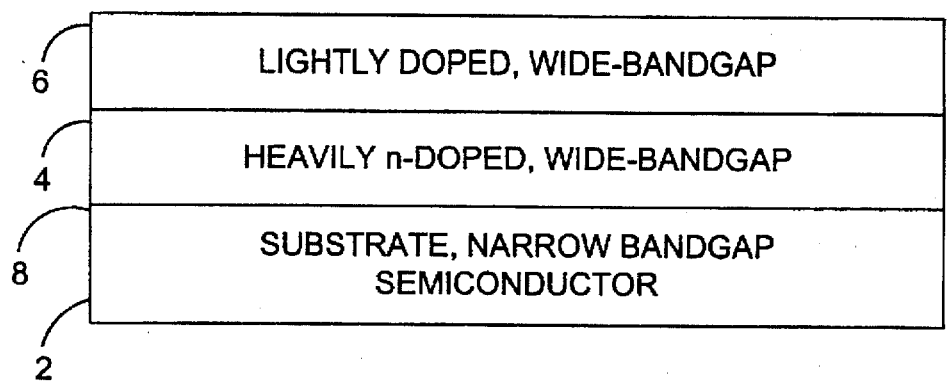
FIG. 1a is a cross-sectional schematic of the layer sequence used in a conventional MODFET.

Referring firstly to FIG. 1a, shown is the layered structure of a conventional n-channel MODFET. The substrate 2 is a narrow bandgap semiconductor such as GaAs. A heavily n-doped, wide-band gap semiconductor layer 4 made of a material such as AlGaAs is deposited on the substrate 2. Upon this is deposited a lightly n-doped, wide-band gap semiconductor layer 6 such as AlGaAs.

Figure 1D:
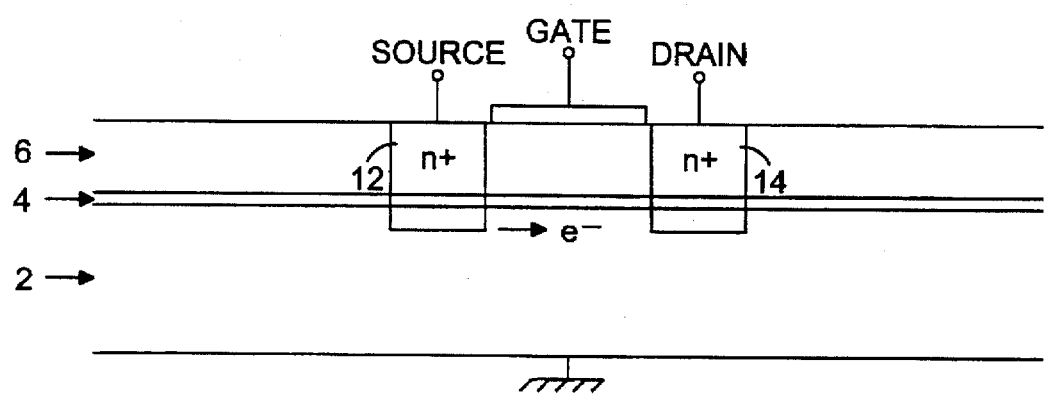
FIG. 1d is a simplified cross-sectional schematic of a conventional n-channel MODFET.
Figure 1B:
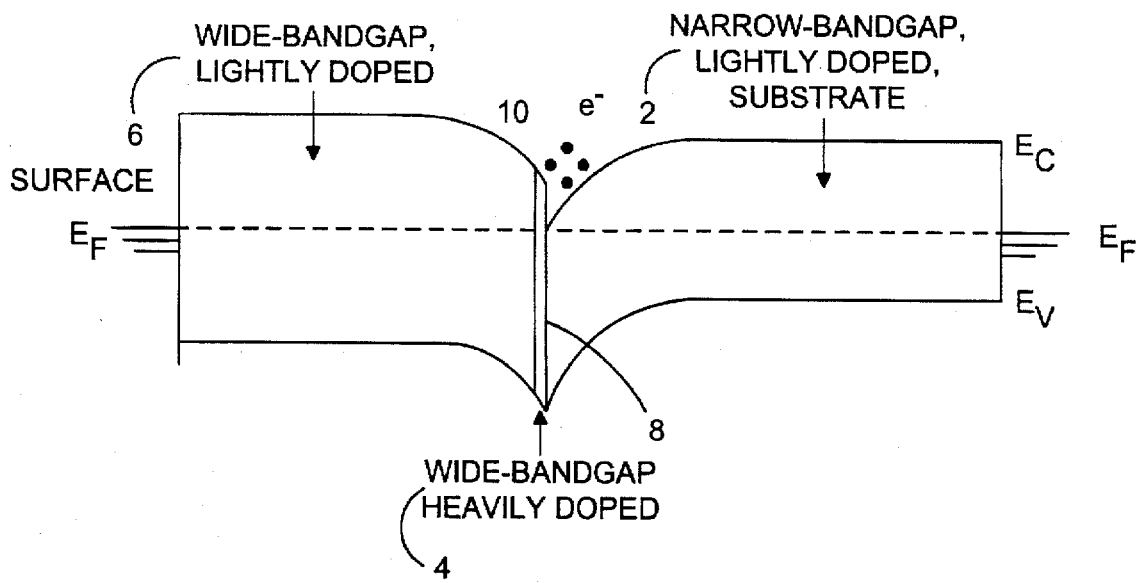
FIG. 1b is the energy band diagram of a conventional n-channel MODFET.
Figure 1C:
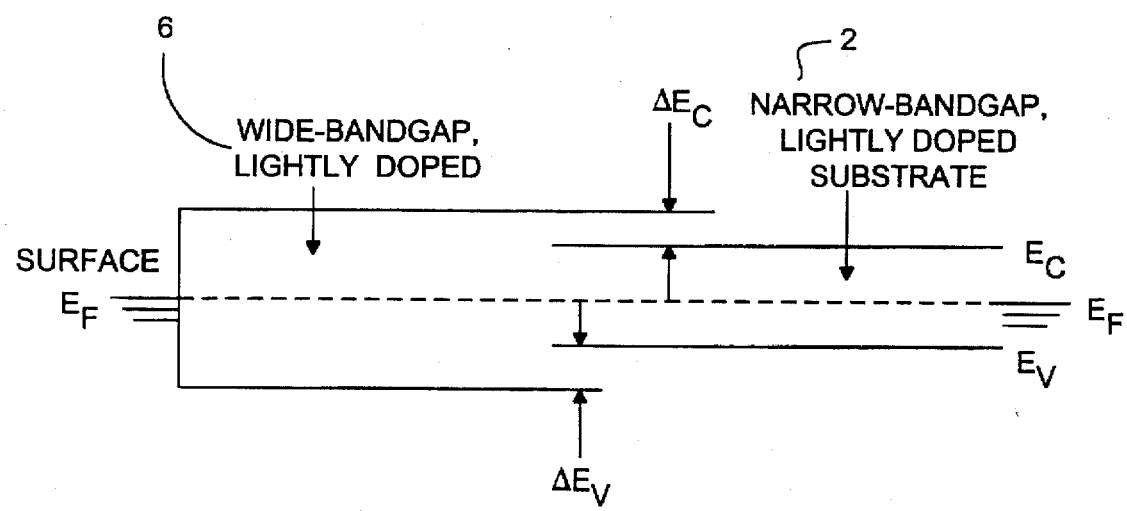
FIG. 1c is a modified version of the energy band diagram of FIG. 1b illustrating the conduction and valance band alignments.

In FIG. 1b, a bandgap diagram for the n-channel structure of FIG. 1a is shown. $E_f$ refers to the position of the Fermi level, $E_c$ to the position of the conduction band, $E_v$ to the position of the valence band, and e- to the accumulation of free electrons which forms at the heterojunction. FIG. 1c illustrates a similar energy band diagram in which the details of the change in the energy bands near the heavily doped layer 4 have been left out so as to highlight the parameters $\Delta E_c$ and $\Delta E_v$, the conduction and valence band hetero-offsets, respectively. The doped layer 4 adjacent to the heterojunction 8 is a source of free carriers which fill the local energy minimum 10 for electrons. The conduction properties of the channel under equilibrium conditions can be specified by appropriately doping the adjacent layers. A p-channel device would require an energy minimum for holes in the valence band, but as can be seen, this does not exist.

The source and drain of the MODFET can be formed by implanting the semiconductor heterostructure from the surface with a dopant ion. In FIG. 1d, an n-channel device is shown, and as such, the source 12, and drain 14 are heavily n-doped regions which effectively form regions where low resistance electrical contacts to the channel are made and where free carriers can be supplied to or extracted from the channel.

Figure 2A:
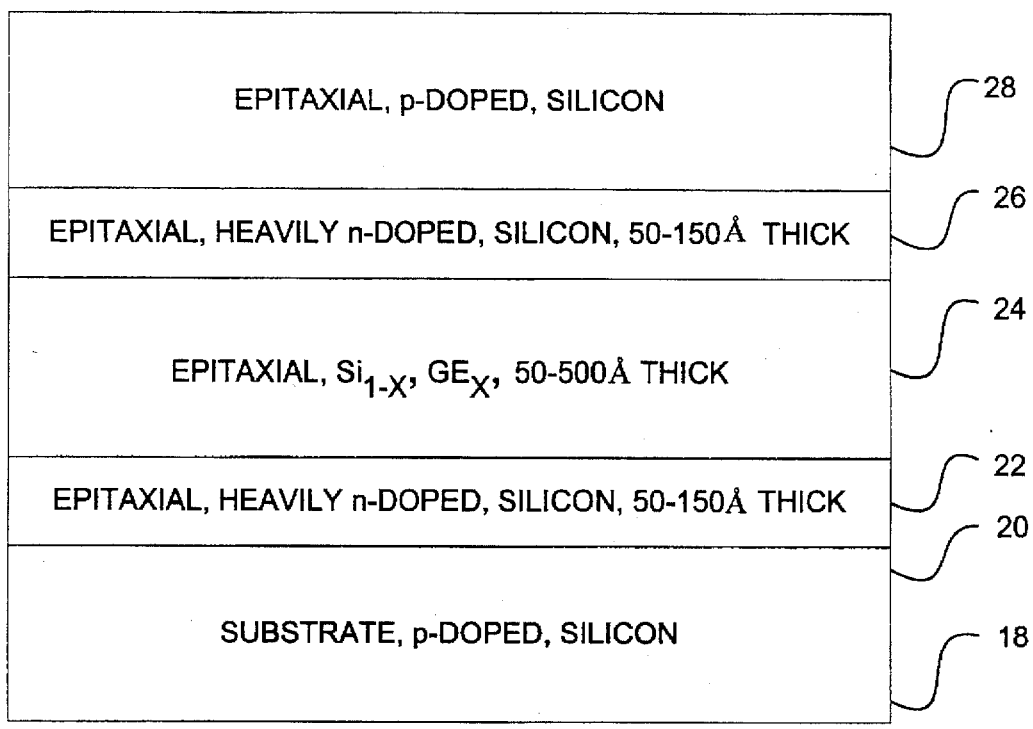
FIG. 2a is a cross-sectional schematic of the layer sequence according to the invention which permits the realization of complementary Si/Si$_{1-x}$Ge$_x$-based MODFETs.

FIG. 2a illustrates an example of a Si/Si$_{1-x}$Ge$_x$ based heterostructure according to the invention which enables fabrication of both n-channel and p-channel MODFET devices on the same heterostructure. The heterostructure typically is fabricated on a conventional silicon substrate 18 which forms part of a wafer. On the substrate 18 is grown a first layer 20 made of lightly p-doped silicon which in the illustrated embodiment is shown as a continuation of the silicon substrate layer. Next there is a second layer 22 made of heavily n-doped Si with a doping range preferably between $5 \times 10^{17}$ and $5 \times 10^{19}$ dopant atoms/cm$^3$. Following this, a third layer 24 made of Si$_{1-x}$Ge$_x$ alloy is grown. The inverse of the layer sequence leading up to the growth of Si$_{1-x}$Ge$_x$ is then grown on top of the Si$_{1-x}$Ge$_x$ film. This comprises a fourth layer made of heavily n-doped Si 26 followed by a fifth layer made of lightly p-doped Si 28. As discussed further below, numerous variants exist for the materials used for each of the layers. The thicknesses of the various layers, and the germanium content in the alloy layer are design parameters as will also be discussed further below. A preferred thickness for the first layer 20 is 100 Å to 5000 Å. A preferred thickness for the heavily n-doped Si layers 22, 26 is 50–150 Å. A preferred thickness for the alloy layer 24 is 50–500 Å. Finally, a preferred germanium fraction x for the alloy layer is 0.01 to 0.1. These ranges are preferred only, and are not intended to provide strict limits.

Figure 2B:
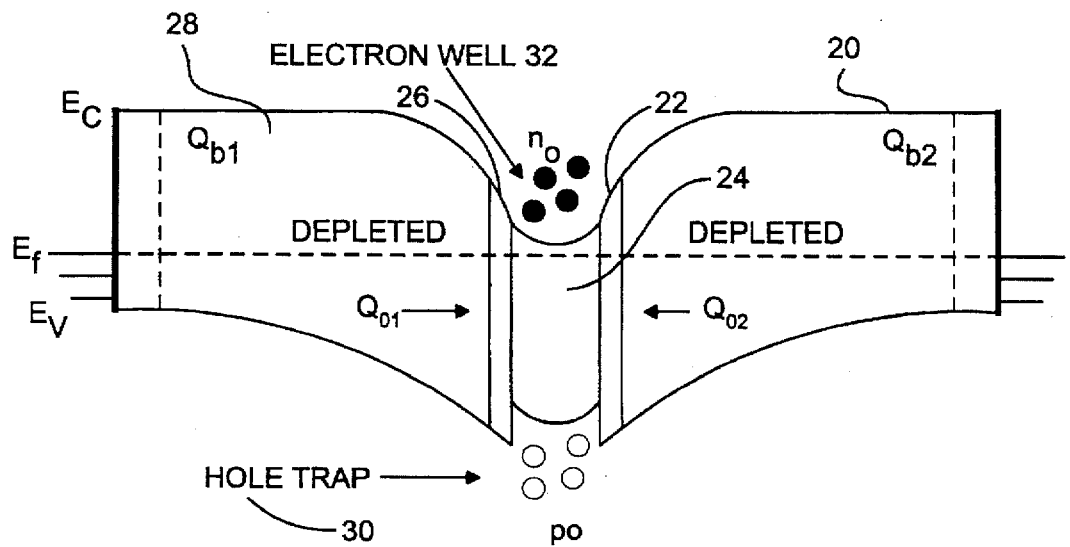

FIG. 2b illustrates the energy band diagram for the heterostructure of FIG. 2a as a function of depth in a direction normal to the surface of the wafer. The difference in the valence band $E_v$ for the $Si_{1-x}Ge_x$ layer 24 and the heavily doped silicon layers 22,26 gives rise to a hole trap 30. The heavily n-doped layers 22,26 adjacent the $Si_{1-x}Ge_x$ layer pull down the conduction band $E_c$ to form an electron well 32.

With continuing reference to FIG. 2b, under equilibrium conditions, charge neutrality dictates that the population of free carriers in the various regions must satisfy the equation:

$$Q_{b1}+Q_{b2}+Q_{o1}+Q_{o2}+n_o+p_o=0$$

where $Q_{b1}$ and $Q_{b2}$ are the charges found in the depleted regions surrounding the heterojunctions, $Q_{o1}$ and $Q_{o2}$ are the charges associated with the ionized donors in the thin heavily doped layers adjacent to the heterojunctions, $n_o$ is the free electron charge which resides in the local energy minimum of the conduction band, and $p_o$ the free hole charge which resides in the local energy minimum of the valence band.

The $Si_{1-x}Ge_x$ layer 24 is grown commensurately on silicon and therefore is strained. The strain may increase the magnitude of the valence band hetero-offset [4]. Values of x, the germanium atomic fraction, other than 0.01 to 0.10 are also suitable; the salient factor being that the magnitudes of the valence and conduction band hetero-offsets are proportional to x[6]. Larger hetero-offsets improve confinement of the free carriers and render a device more sensitive to the gate potential.

Figure 3A:
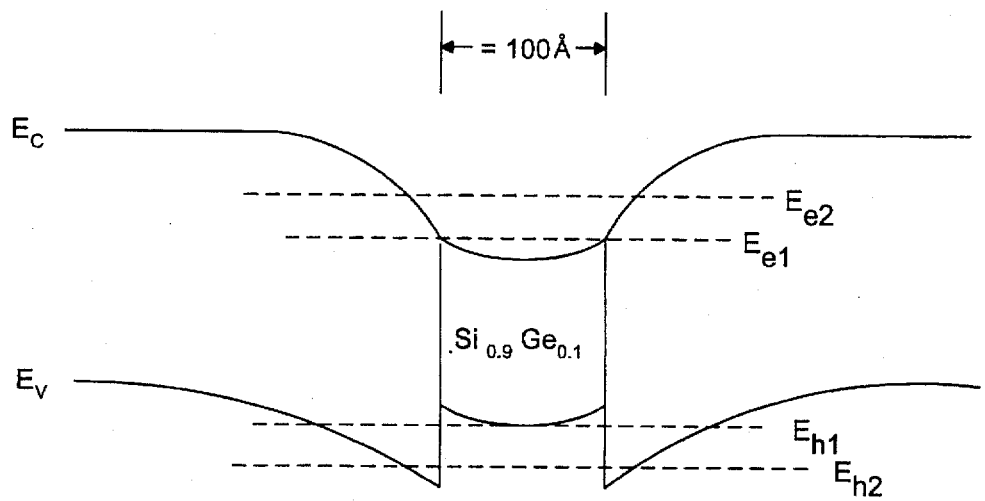
FIG. 3a is the energy band diagram (in the region of the heterojunctions) for a thin (50 Å–150 Å) Si$_{1-x}$Ge$_x$ alloy layer showing the discrete free carrier energy levels which arise due to quantum confinement effects.
Figure 3B:
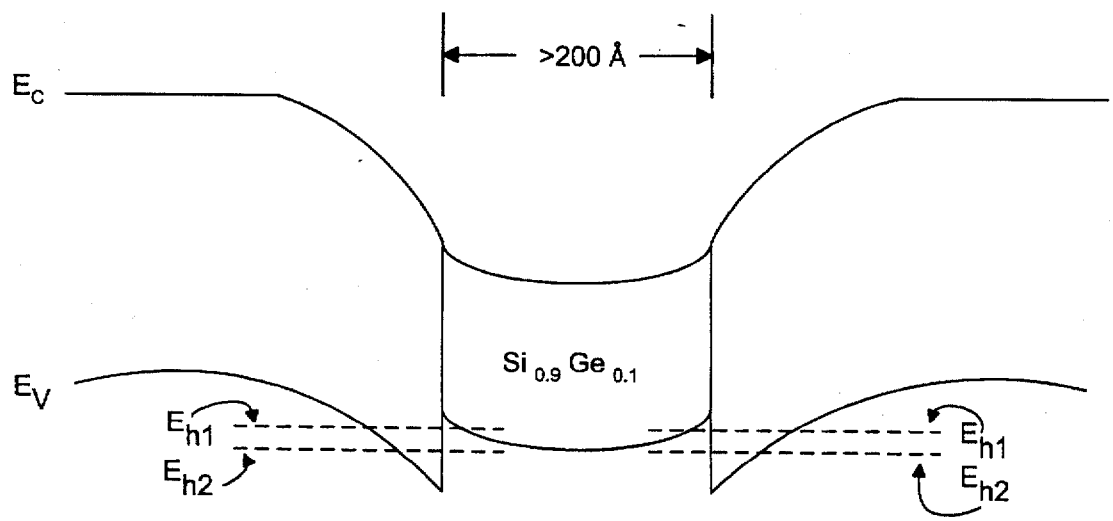
FIG. 3b is the energy band diagram (in the region of the heterojunctions) for a thick Si$_{1-x}$Ge$_x$ alloy layer showing the discrete free carrier energy levels which arise due to quantum confinement effects.

In addition to the germanium fraction x, the thickness of the $Si_{1-x}Ge_x$ layer 24 is also a design parameter which will determine the conduction properties of the channel. A thin $Si_{1-x}Ge_x$ layer (50–150 Å) will introduce quantum confinement induced energy levels throughout the layer as shown in FIG. 3a in which $E_{e1}$ and $E_{e2}$ refer to the first and second energy levels respectively for electrons. $E_{h1}$ and $E_{h2}$ refer to the first and second energy levels respectively for holes. $E_c$ again refers to the position of the conduction band, and $E_v$ to the position of the valence band. In contrast, as shown in FIG. 3b, which is a bandgap diagram for an example of a heterostructure with a thicker $Si_{1-x}Ge_x$ layer, the carriers will be confined to the centre of layer 24 for electrons and at the heterojunctions for the holes. In FIG. 3b, $E_{h1}$ and $E_{h2}$ refer to the first and second, respectively, energy levels for holes. $E_c$ refers to the position of the conduction band, and $E_v$ to the position of the valence band. In this case, no discrete energy levels for electrons arise while the energy levels for holes are found immediately adjacent to the heterojunctions.

Where the $Si_{1-x}Ge_x$ layer is thin, quantum confinement improves carrier mobility which results in improved electrical performance of the device. When the $Si_{1-x}Ge_x$ layer is thicker, the carriers no longer benefit from the effects of quantum confinement and mobility may decrease. The benefit of quantum confinement may be offset by the fact that thin layers are difficult to fabricate repeatably and consistently.

The thickness t of the channel and the fraction of germanium x must be also determined such that the channel is substantially free of dislocations. A high density of dislocations may for example result in a short circuit in one of the electronic devices. Note that in this context, the crystal being substantially dislocation free means that the semiconductor crystal lattice maintains its crystalline order across the boundaries between the layers of silicon 20,24,28 and the layers of silicon alloy 22,26. Both pseudomorphic crystals and unconditionally stable crystals are substantially dislocation free. An unconditionally stable crystal will maintain its crystalline order at temperatures all the way up to the melting point of the crystal. In contrast, a pseudomorphic crystal will begin to dislocate at temperatures less than the melting point. A difference in the equilibrium lattice constant of the core and that of the cladding introduces strain in the resulting crystal. Strain increases with increasing difference in the lattice constants and with increasing thickness of the alloy layer. The difference in the lattice constants is determined by the alloy compositions of the layers. If the strain on the crystal is large enough, the crystal will no longer be substantially dislocation free. Strain increases with the thickness of the channel and with the fraction of germanium. Thus for a higher germanium content, there is a smaller critical thickness before dislocations may be induced. Assuming the SiGe layer thickness is kept below the critical thickness at which the crystal is no longer substantially dislocation free, a device with a thicker SiGe channel layer is more manufacturable.

The band alignment of strained $Si_{1-x}Ge_x$ to Si is TYPE I, i.e. with most of the difference in energy bandgap incorporated into the valence band [4]. For example, for x=0.10, the conduction band offset, $\Delta E_c$=0.02eV and $\Delta E_v$=0.07eV [5]. For this reason, a heterostructure which does not include the two doped regions adjacent the $Si_{1-x}Ge_x$ layer will have an energy minimum for holes defined by the valence band hetero-offset, but will not have an energy minimum for electrons.

As a potential is applied to the gate and the depletion regions surrounding the heterojunctions is modulated, so will the free carrier population in the channels. This is the basis of conductivity modulation in the channel and the basis of operation of $Si_{1-x}Ge_x$ based CMODFETs. Further, the doping which is intentionally introduced in the heavily doped layers adjacent to the heterojunctions will determine (via the charge neutrality condition) the equilibrium channel properties [6]. This doping is a design parameter which will specify enhancement or depletion mode operation of both the n-channel and p-channel MODFETs. A general quantum mechanical treatment of these types of channel regions has been described in the literature [2]. Also specified by the various doping in the layers of the heterostructure is the voltage of operation of the device; that is, the range which the gate potential affects the conductivity of the channel affected.

Figure 4:
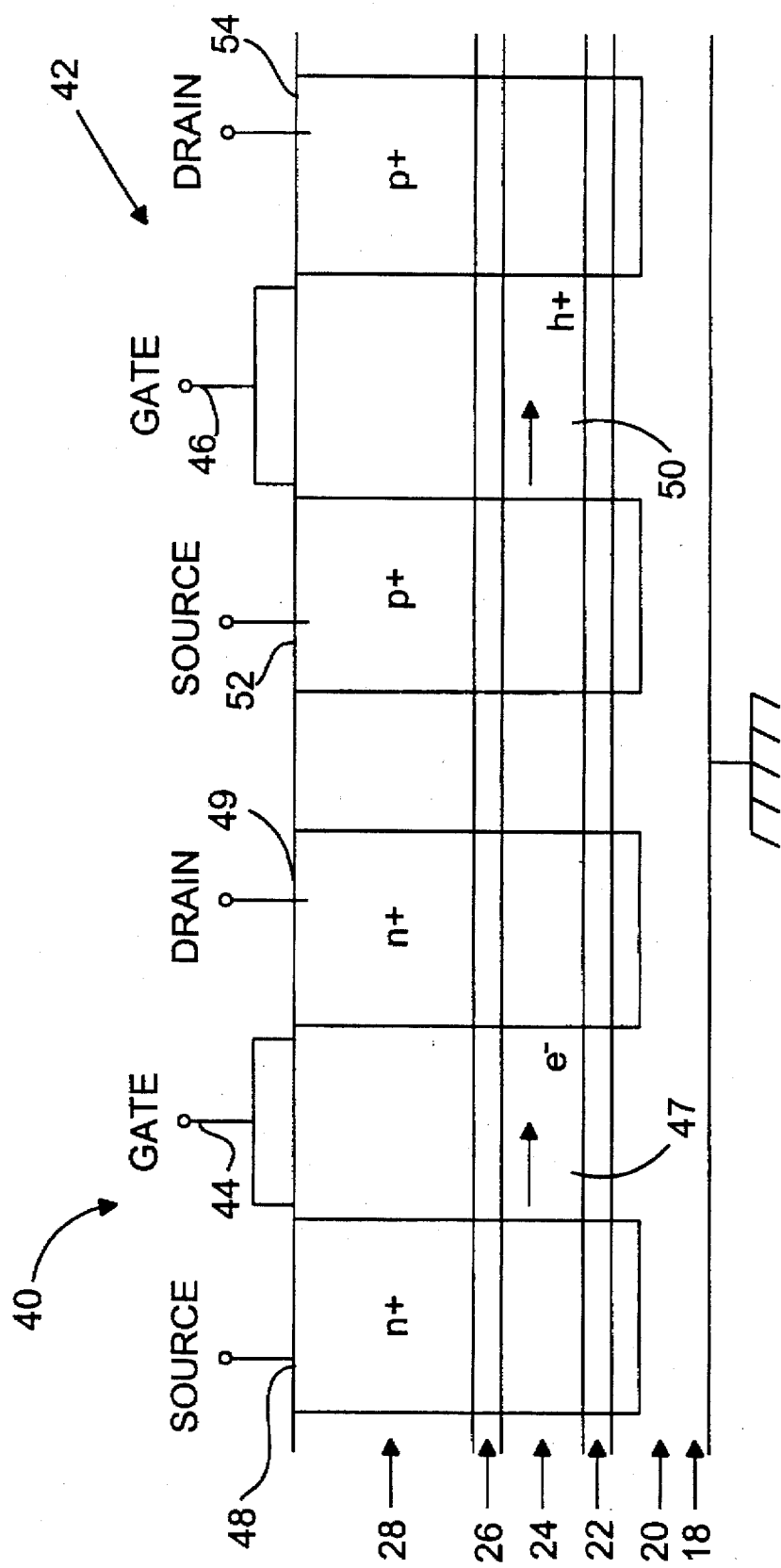
FIG. 4 is a simplified cross-sectional schematic of an n-channel and a p-channel Si/Si$_{1-x}$Ge$_x$-based MODFET according to the invention in which implanted heavily n-doped and p-doped regions extending to the Si$_{1-x}$Ge$_x$ layer are used.

FIG. 4 illustrates a layered structure according to the invention upon which has been fabricated both an n-channel MODFET 40 and a p-channel MODFET 42. Conventional gate electrodes 44,46 are provided. Contact to the channel 47 of the n-channel MODFET 40 is achieved with implanted heavily n-doped source 48 and drain 49 regions which must extend from the surface of the heterostructure down through at least a portion of the layer 24 in which the MODFET channels are located. Preferably, the implanted regions 48 and 49 extend from the surface all the way through the channel layer 24. In the illustrated embodiment, the implanted regions 48 and 49 extend from the surface down to the layer 20 above the substrate. In any case, these implanted regions should not extend all the way down to the substrate. Likewise, contact to the channel 50 of the p-channel MODFET 42 is achieved with implanted heavily p-doped source 52 and drain 54 regions which extend from the surface preferably down to layer 20 above the substrate.

Conventional VLSI fabrication technology is applicable to the formation of n-channel MODFETs, p-channel MODFETs and CMODFET circuits, all designed according to the invention. This complementary nature is a result of a heterostructure which is unique to this design. The type of device fabricated depends only on the type of contact (n-type or p-type) made to the $Si_{1-x}Ge_x$ layer.

Figure 5:
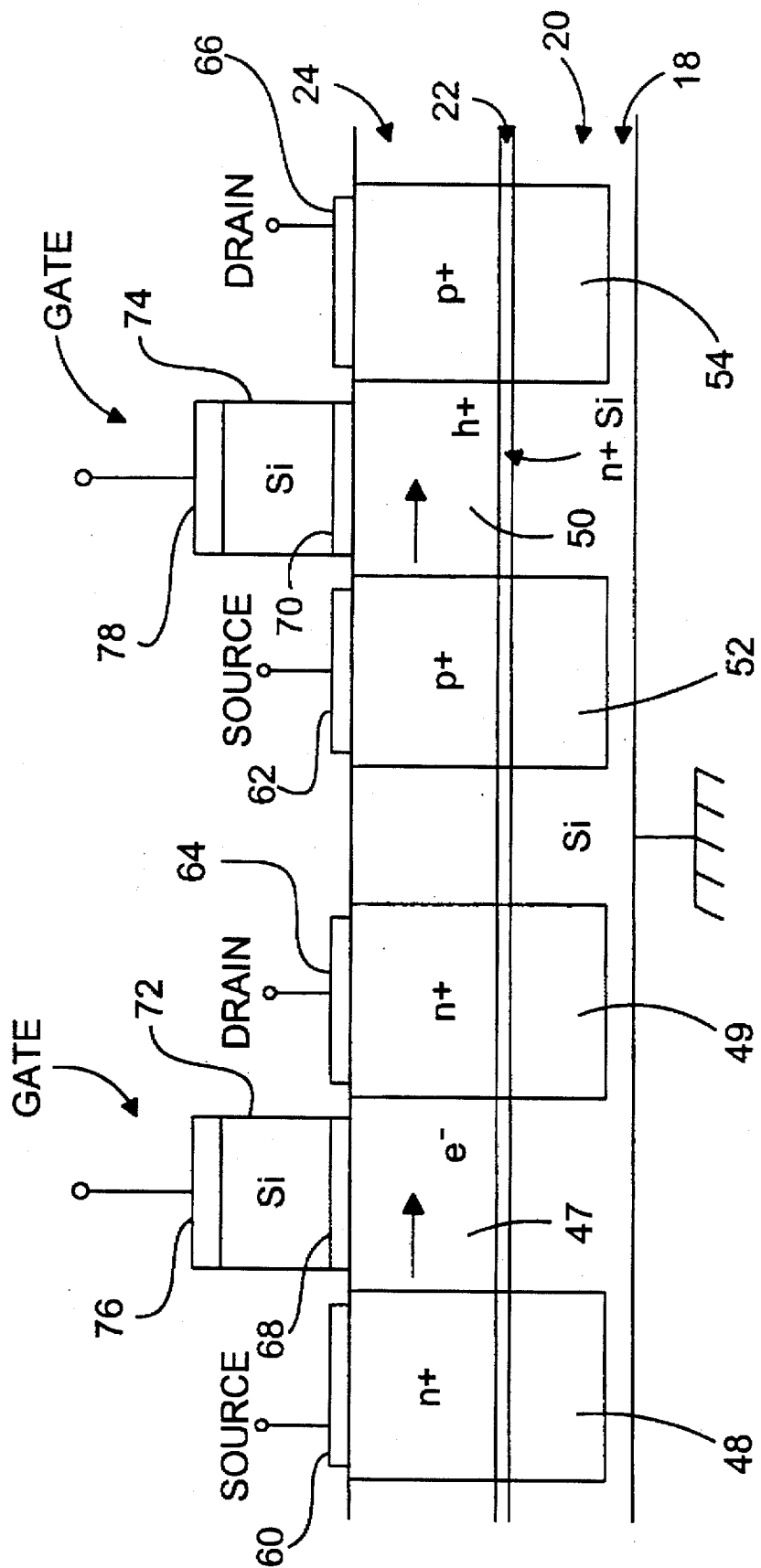
FIG. 5 is a simplified cross-sectional schematic of an n-channel and a p-channel Si/Si$_{1-x}$Ge$_x$-based MODFET according to the invention in which mesa structures are used.

Referring now to FIG. 5, shown is another embodiment of the invention in which a different realization of the semiconductor heterostructure described above is employed to the same effect.

FIG. 5 illustrates both an n-channel and p-channel MODFET realized using the modified heterostructure. A substrate 18, bottom silicon layer 20, heavily n-doped silicon layer 22, and a channel layer 24 are provided as before. Rather than having several further continuous layers formed upon the channel layer 24, this embodiment employs a mesa structure. The mesa structure includes heavily n-doped silicon regions 68,70 provided only where required, namely between where the source and drain of each device are to be located. These heavily n-doped regions 68,70 perform the same function as the second heavily n-doped layer 26 in FIG. 4. Upon each of the heavily n-doped regions 68,80 is located a lightly p-doped silicon region 72,74 and gate electrode 76,78. Mesa structure regions are formed by depositing or growing planar layers of material, and etching away the material around where the mesa structure regions are to be located. After etching away the material to form the mesa structure, the heavily doped source regions 48,52 and drain regions 49,54 are implanted. In the illustrated embodiment, source and drain pair 48,49 are heavily n-doped as required for the the formation of an n-channel device, and source and drain pair 52,54 are heavily p-doped as required for the formation of a p-channel device. After the mesa structure has been etched and the implanted regions formed, source 60,62 and drain 64,66 electrodes are formed. The silicon layers 72,74 perform the same function as the top silicon layer 28 in FIG. 4, namely to isolate the gate electrodes 76,78 from the channels 44,50.

Although particular embodiments of the invention have been described in detail, numerous modifications, variations and adaptations may be made without departing from the scope of the invention as defined in the claims.

With respect to the semiconductor materials used for the five layers, any or all of them could be made of a group IV silicon alloy. The alloy used in the channel (or in the other layers) might be a group IV alloy other than SiGe, such as SiC. Of course, it is important that any layered structure must yield a crystal which is substantially free of dislocations. Another important feature which must be present is that the resulting layer structure possesses a bandgap structure similar to that of FIG. 2b. That is to say, firstly there must be a valence band hetero-offset between the alloy used in the channel and the adjacent heavily n-doped layers, and secondly the heavily n-doped layers must result in a conduction band well in the channel.

With respect to the doping of the layers other than the heavily n-doped layers 22,26 the channel layer 24 should preferably be free of any doping, but this is not easily done with today's manufacturing techniques which almost always introduced some spurious doping. Any spurious doping in the channel layer 24 must be small enough to avoid serious effects upon the conductivity of the channel.

The p-doping of the layers 20,28 is a design parameter which determines the levels of parasitic MOSFET conduction and current leakage. Either no doping or light p-doping may be employed in these layers. These layers cannot be heavily doped because that will result in the formation of a low resistance connection between the source and drain, forming a conduction path parallel with the channel. If there is no doping at all, then likely some parasitic MOSFET conduction will occur consisting of current flow in layer 28 between the source and the drain. Light p-doping in these layers results in a high resistance to current flow in these layers. Despite this, in most cases there will be some current leakage from the source through layer 28 to the gate.

In the embodiments described, the gate electrode makes direct contact with the top silicon layer 28, and this assumes that a good schottky diode can be made thereby minimizing leakage current. Alternatively, the gate electrode may be electrically isolated by interposing between the electrode and the silicon layer an oxide layer (as in a MOSFET). This eliminates the current leakage. There still may be current flowing in the top layer 28 beneath the oxide layer, and this is again parasitic MOSFET conduction. It is usually desirable to minimize MOSFET behaviour.

REFERENCES

[1] R. Dingle, et al., "Electron Mobilities in Modulation-Doped Semiconductor Heterojunction Superlattices," Appl. Phys. Lett., Vol. 33, p. 665.

[2] C. Weisbuch and B. Vinter, Quantum Semiconductor Structures. Academic Press, 1991.

[3] G. Abstreiter et al., "Strain-induced two-dimensional electron gas in selectively doped $Si_{1-x}Ge_x$ superlattices," Phys. Rev. Lett., Vol. 54, p. 2441.

[4] R. People, "Indirect band gap of coherently strained bulk $Ge_xSi_{1-x}/Si$ alloys on (001) silicon substrates," Phys. Rev., Vol. 1332, p. 1405. $Si_{1-x}Ge_x$

[5] R. People, "Physics and Applications of $Ge_xSi_{1-x}/Si$ Strained Layer Heterostructures," IEEE 1. Quantum Electron., Vol. QE-22, p. 1696.

[6] R. People, et al., "Modulation-doping in $Ge_xSi_{1-x}/Si$ strained-layer heterostructures," Appl. Phys. Lett., Vol. 45, p. 1231.

I claim:

1. A semiconductor heterostructure enabling the fabrication of both n-channel and p-channel modulation doped field effect transistors (MODFET) comprising in sequence:

a first undoped or lightly p-doped layer of silicon or silicon alloy;

a second heavily n-doped layer of silicon or silicon alloy;

a third silicon alloy layer;

a fourth heavily n-doped layer of silicon or silicon alloy;

a fifth undoped or lightly p-doped layer of silicon or silicon alloy;

wherein a conduction band well exists in the third layer and a valence band hetero-offset exists between the third layer and each of the second and fourth layers.

2. The heterostructure of claim 1 wherein the first, second, fourth and fifth layers are silicon.

3. The heterostructure of claim 2 wherein the silicon alloy of the third layer is $Si_{1-x}Ge_x$ with $0<x<1$.

4. The heterostructure of claim 2 wherein the silicon alloy of the third layer is SiC.

5. The heterostructure of claim 3 wherein the second and fourth layers are 50–150 Å thick.

6. The heterostructure of claim 3 wherein the third layer is 50–500 Å thick.

7. The heterostructure of claim 3 wherein $0.01 \leq x \leq 0.1$.

8. The heterostructure of claim 3 wherein the doping of the second and fourth layers is in the range $5 \times 10^{17}$ to $5 \times 10^{19}$ dopant atoms/cm$^3$.

9. The heterostructure of claim 1 further comprising:
a heavily n-doped source region and a heavily n-doped drain region extending from spaced apart locations on the fifth layer of the heterostructure down through at least a portion of the third layer;
a source electrode on a surface of the source region;
a drain electrode on a surface of the drain region; and
a gate electrode located on the fifth layer of the heterostructure between the source and the drain electrodes;
thereby forming an n-channel modulation doped field-effect transistor.

10. The heterostructure of claim 1 further comprising:
a heavily p-doped source region and a heavily p-doped drain region, extending from spaced apart locations on the fifth layer of the heterostructure down through at least a portion of the third layer;
a source electrode on the surface of the source region;
a drain electrode on the surface of the drain region; and
a gate electrode located on the fifth layer of the heterostructure between the source and the drain regions;
thereby forming a p-channel modulation doped field-effect transistor.

11. The heterostructure of claim 1 further comprising:
a) at least one n-channel MODFET consisting of:
a heavily n-doped source region and a heavily n-doped drain region extending from spaced apart locations on the fifth layer of the heterostructure down through at least a portion of the third layer; and
a source electrode on the surface of the source region;
a drain electrode on the surface of the drain region;
a gate electrode located on the fifth layer of the heterostructure between the heavily n-doped source and the drain regions; and
b) at least one p-channel MODFET consisting of:
a heavily p-doped source region and a heavily p-doped drain region, extending from spaced apart locations on the fifth layer of the heterostructure down through at least a portion of the third layer;
a source electrode on the surface of the source region;
a drain electrode on the surface of the drain region;
a gate electrode located on the fifth layer of the heterostructure between the heavily p-doped source and the drain regions.

12. A heterostructure according to claim 9 in which the heavily doped source and drain regions extend at least as far as the second layer.

13. A heterostructure according to claim 10 in which the heavily doped source and drain regions extend at least as far as the second layer.

14. A heterostructure according to claim 11 in which the heavily doped source and drain regions extend at least as far as the second layer.

15. A heterostructure according to claim 14 wherein the first, second, fourth and fifth layers are silicon, and wherein the silicon alloy of the third layer is $Si_{1-x}Ge_x$, with $0.01 < x$ 0.10.

16. A semiconductor heterostructure enabling the fabrication of both n-channel and p-channel modulation doped field effect transistors (MODFET) comprising
a) a sequence of layers comprising:
a first undoped or lightly p-doped layer of silicon or silicon alloy;
a second heavily n-doped layer of silicon or silicon alloy;
a third silicon alloy layer;
b) for each MODFET to be fabricated
a heavily doped source region and a heavily doped drain region extending through at least a portion of the third layer, the source region and the drain region being of the same conductivity type;
a drain electrode on the drain region and a source electrode on the source region;
a first heavily n-doped mesa structure layer of silicon or silicon alloy between the drain electrode and the source electrode;
a second undoped or lightly p-doped mesa structure layer of silicon or silicon alloy overlying the first mesa structure layer; and
a gate electrode on the second mesa structure layer;
wherein a conduction band well exists in the third layer and a valence band hetero-offset exists between the third layer and each of the second layer and the first mesa structure layer.

17. The heterostructure of claim 16 wherein all layers are silicon with the exception of the third layer.

18. The heterostructure of claim 16 wherein the silicon alloy of the third layer is $Si_{1-x}Ge_x$, with $0 < x < 1$.

19. The heterostructure of claim 18 wherein $0.01 \leq x \leq 0.01$.

20. The heterostructure of claim 16 comprising
at least one said MODFET in which the heavily doped source and drain regions are heavily n-doped thereby forming an n-channel modulation doped field-effect transistor; and
at least one said MODFET in which the heavily doped source and drain regions are heavily p-doped thereby forming a p-channel modulation doped field-effect transistor.

* * * * *